United States Patent
Liu (10) Patent No.: US 10,750,097 B2
(45) Date of Patent: Aug. 18, 2020

(54) VARYING EXPOSURE TIME OF PIXELS IN PHOTO SENSOR USING MOTION PREDICTION

(71) Applicant: Facebook Technologies, LLC, Menlo Park, CA (US)

(72) Inventor: Xinqiao Liu, Medina, WA (US)

(73) Assignee: FACEBOOKE TECHNOLOGIES, LLC, Menlo Park, CA (US)

(*) Notice: Subject to any disclaimer, the term of this patent is extended or adjusted under 35 U.S.C. 154(b) by 18 days.

(21) Appl. No.: 15/983,391

(22) Filed: May 18, 2018

(65) Prior Publication Data

US 2019/0052788 A1   Feb. 14, 2019

Related U.S. Application Data (60) Provisional application No. 62/545,356, filed on Aug. 14, 2017.

(51) Int. Cl.
| | |
|---|---|
| *H04N 5/235* | (2006.01) |
| *H04N 5/369* | (2011.01) |
| *H04N 5/232* | (2006.01) |
| *H04N 5/353* | (2011.01) |
| *H01L 25/16* | (2006.01) |
| *H04N 5/14* | (2006.01) |

(52) U.S. Cl.
CPC ......... *H04N 5/2353* (2013.01); *H01L 25/167* (2013.01); *H04N 5/23254* (2013.01); *H04N 5/23258* (2013.01); *H04N 5/3532* (2013.01); *H04N 5/3535* (2013.01); *H04N 5/379* (2018.08); *G06T 2207/20* (2013.01); *H04N 5/144* (2013.01)

(58) Field of Classification Search
CPC .. H04N 5/2353; H04N 5/353; H04N 5/23277; H04N 5/3535; H04N 5/23258; H04N 5/379; H04N 5/23254; H04N 5/144; G06T 2207/20

See application file for complete search history.

(56) References Cited

U.S. PATENT DOCUMENTS

| | | |
|---|---|---|
| 2007/0092244 A1 | 4/2007 | Pertsel et al. |
| 2009/0002528 A1 | 1/2009 | Manabe et al. |
| 2009/0091645 A1 | 4/2009 | Trimeche et al. |
| 2009/0128640 A1 | 5/2009 | Yumiki |

(Continued)

FOREIGN PATENT DOCUMENTS

| | | |
|---|---|---|
| EP | 2063630 A1 | 5/2009 |
| WO | WO 2017/058488 A1 | 4/2017 |

OTHER PUBLICATIONS

Extended European Search Report, European Application No. 18188684.7, dated Jan. 16, 2019, 10 pages.

(Continued)

*Primary Examiner* — Christopher K Peterson (74) *Attorney, Agent, or Firm* — Kilpatrick Townsend & Stockton LLP (57) ABSTRACT

A photo sensor array is divided up into multiple blocks that are operated with different exposure times. A prediction algorithm is used to predict the overall light brightness of each block and determine the exposure time of each block. Each block may also include memory to store the exposure time for the pixels in the block as well as analog-to-digital resolution for the block.

22 Claims, 7 Drawing Sheets

(56) References Cited

U.S. PATENT DOCUMENTS

| | | | | |
|---|---|---|---|---|
| 2011/0149116 A1* | 6/2011 | Kim | ...................... | H04N 5/335 |
| | | | | 348/231.99 |
| 2012/0039548 A1* | 2/2012 | Wang | .................. | H03M 1/1009 |
| | | | | 382/312 |
| 2013/0293752 A1* | 11/2013 | Peng | ...................... | H04N 5/353 |
| | | | | 348/295 |
| 2017/0366766 A1* | 12/2017 | Geurts | ................. | H04N 5/3532 |

OTHER PUBLICATIONS

PCT International Search Report and Written Opinion, PCT Application No. PCT/US2018/045666, dated Dec. 3, 2018, 15 pages.
European Patent Application No. 18188684.7, Office Action dated Nov. 26, 2019, 9 pages.

\* cited by examiner

VARYING EXPOSURE TIME OF PIXELS IN PHOTO SENSOR USING MOTION PREDICTION

CROSS REFERENCE TO RELATED APPLICATIONS

This application claims the benefit of U.S. Provisional Application No. 62/545,356 filed Aug. 14, 2017, which is incorporated by reference in its entirety.

BACKGROUND

Field of Technology

This disclosure relates generally to photo sensors, and more particularly, to using a predictive algorithm to adjust exposure times of photo sensors.

Discussion of the Related Art

Photo sensors are electronic detectors that convert light into an electronic signal. In photography, a shutter is a device that allows light to pass for a determined period of time, exposing the optical sensors to the light in order to capture an image of a scene. Rolling shutter is a method of image capture in which a still picture or each frame of a video is captured by scanning across the scene rapidly in a horizontal or vertical direction. That is, every pixel is not captured at the same time; pixels from different rows are captured at different times. Rolling shutter is mostly used in cell phone sensors. Machine vision, in contrast, uses global shutter where every pixel is captured at the same time.

Most photo sensors use backside illumination. A back-illuminated sensor is a type of photo sensor that uses a particular arrangement of imaging elements to increase the amount of light captured, improving low-light performance. A traditional front-illuminated digital camera is constructed similar to the human eye, with a lens at the front and photodetectors at the back. This orientation of the sensor places the active matrix of the digital camera sensor, a matrix of individual picture elements, on its front surface and simplifies manufacturing. The matrix and its wiring, however, reflect some of the light, reducing the signal that is available to be captured. A back-illuminated sensor contains the same elements, but arranges the wiring behind the photocathode layer by flipping the silicon wafer during manufacturing and then thinning its reverse side so that light can hit the photocathode layer without passing through the wiring layer, thereby improving the chance of an input photon being captured.

However, conventional photo sensor arrays use global signals to control exposure time and therefore have the same exposure time regardless of lighting conditions. For example, a photo sensor in high light conditions will have the same exposure time as a photo sensor in low light conditions. The same exposure time for different photo sensors may result in over-exposure for some of the photo sensors and under-exposure for other photo sensors

SUMMARY

Embodiments relate to a photo sensor including pixels divided into a plurality of blocks where exposure time of each block is adjusted individually based on motion prediction performed on prior frames. The pixels include photodiodes and transistors controlling an exposure duration of the photodiodes for a current frame. The photo sensor also includes a memory receiving and storing exposure time information for each block indicating an exposure duration for pixels in each block to capture the current frame. The exposure time information is generated by performing motion prediction on prior frames captured by the pixels before capturing the current frame. The photo sensor also includes a control circuit that generates, for each block, timing signals corresponding to the exposure time information for each block stored in the memory, the control circuit coupled to the transistors to provide the timing signals for controlling the exposure duration of each block of pixels.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Overview

Reference will now be made in detail to the preferred embodiment, an example of which is illustrated in the accompanying drawings. Whenever possible, the same reference numbers will be used throughout the drawings to refer to the same or like parts.

Embodiments relate to a photo sensor array divided up into multiple blocks that are operated with different exposure times. A prediction algorithm is used to predict the overall light brightness of each block and determine the exposure time of each block. Each block may also include memory to store the exposure time for the pixels in the block as well as analog-to-digital resolution for the block.

Example System Architecture

Figure 1:
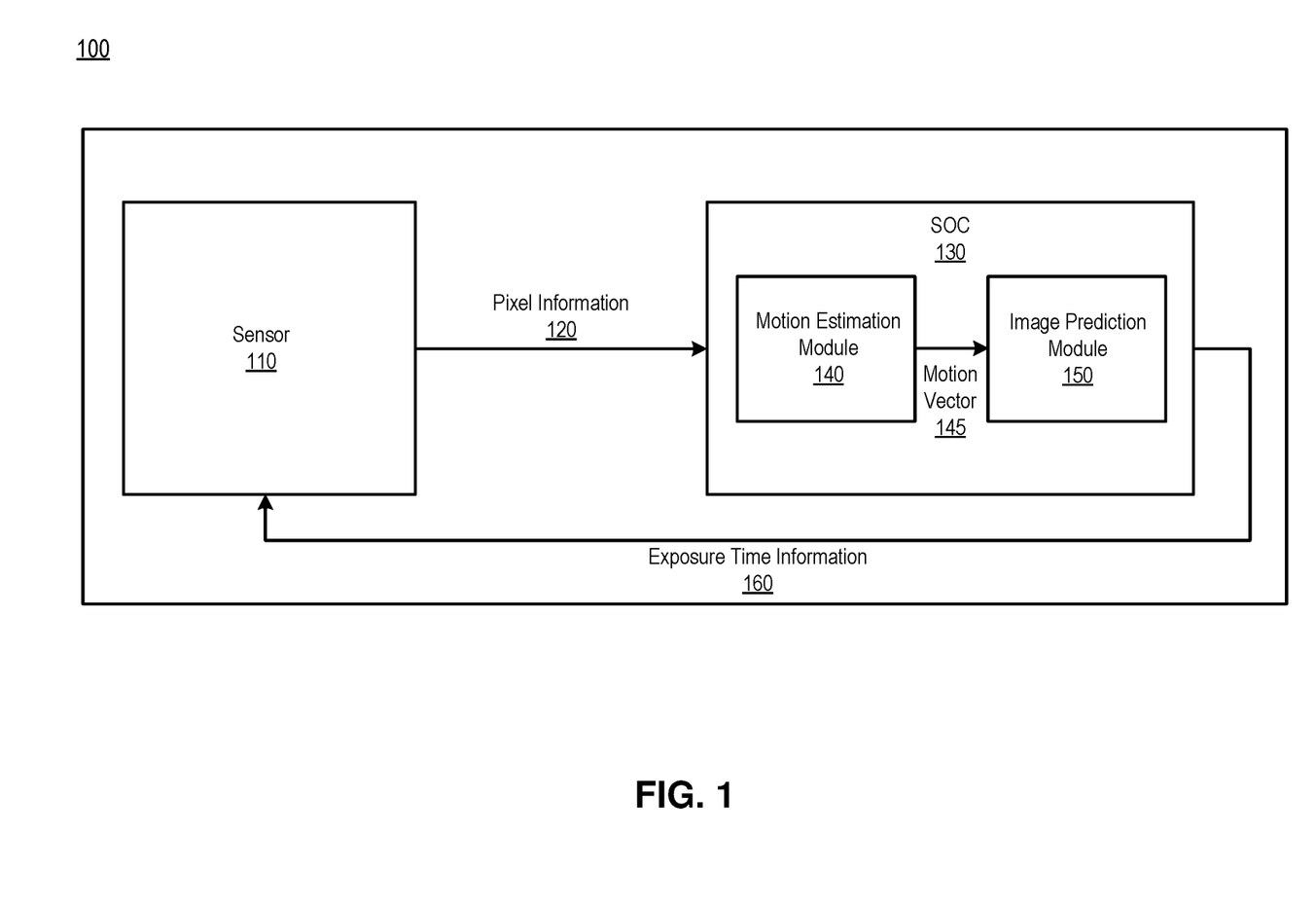
FIG. 1 is a diagram of a system environment in which a photo sensor and a system on a chip (SOC) operate, according to one embodiment.

FIG. 1 is a diagram of a system environment 100 in which a sensor 110 and a system on a chip (SOC) 130 operate, according to one embodiment. The sensor 110 is a circuit that measures intensity of light impinging on its photo sensor on a pixel-by-pixel basis using photoconversion. Measuring light intensity may involve detecting light by a photodiode in a pixel. In response, the pixel performs photoconversion on the detected light into a voltage or current signal. The voltage or current signal representing the intensity of light detected at each pixel may be digitized into pixel information 120, and sent over to the SOC 130.

The sensor 110 and the SOC 130 communicate bi-directionally via an interface circuit that provides communication path for the pixel information 120 and the exposure time information 160. In some embodiments, the interface circuit includes an inter-integrated circuit (I2C) interface circuit for receiving pixel information 120 from the sensor 110, and a Mobile Industry Processor Interface (MIPI) circuit for sending the pixel information 120 from the sensor 110 to the SOC 130. I2C and MIPI are described below with reference to FIG. 2 in detail.

The pixel information 120 includes one or more prior frames provided to the SOC 130 for processing. In some embodiments, the pixel information 120 is streamed for different cycles of the sensor operation where a different frame information is sent over each cycle. Operation of the sensor 110 and its architecture are described below with reference to FIGS. 2 and 4 in detail.

The SOC 130 estimates brightness of pixels or a set of pixels for a current frame based on the pixel information 120 of prior frames. For this purpose, the SOC 130 includes, among other components, a motion estimation module 140 and an image prediction module 150.

The motion estimation module 140 uses a predictive algorithm on the one or more prior frames of the pixel information 120 to predict the next frame. The motion estimation module could also use information from a motion sensing device (e.g., IMU device). In some embodiments, the predictive algorithm is a motion estimation or motion compensation based algorithm. Motion estimation is the process of describing motions between adjacent frames using motion vectors 145. Motion vectors 145 determined by the motion estimation module 140 are provided as an input to the image prediction module 150.

The image prediction module 150 is a circuit, software, firmware or a combination thereof that predicts a highest light intensity and a lowest light intensity captured by the pixels in each block. In some embodiments, the image prediction module 150 further generates an exposure start time and an exposure stop time based on the predicted highest light intensity and the lowest light intensity of pixels in each block. The exposure start time and the exposure stop time are used for controlling the exposure time for a block of pixels. The highest light intensity and the lowest light intensity are used for dynamic resolution change of a block analog-to-digital converter (ADC). The exposure time information 160 includes at least one of: the highest light intensity of pixels in each block, the lowest light intensity of pixels in each block, the exposure start time of a block of pixels, the exposure stop time of a block of pixels, or some combination thereof.

Figure 2:
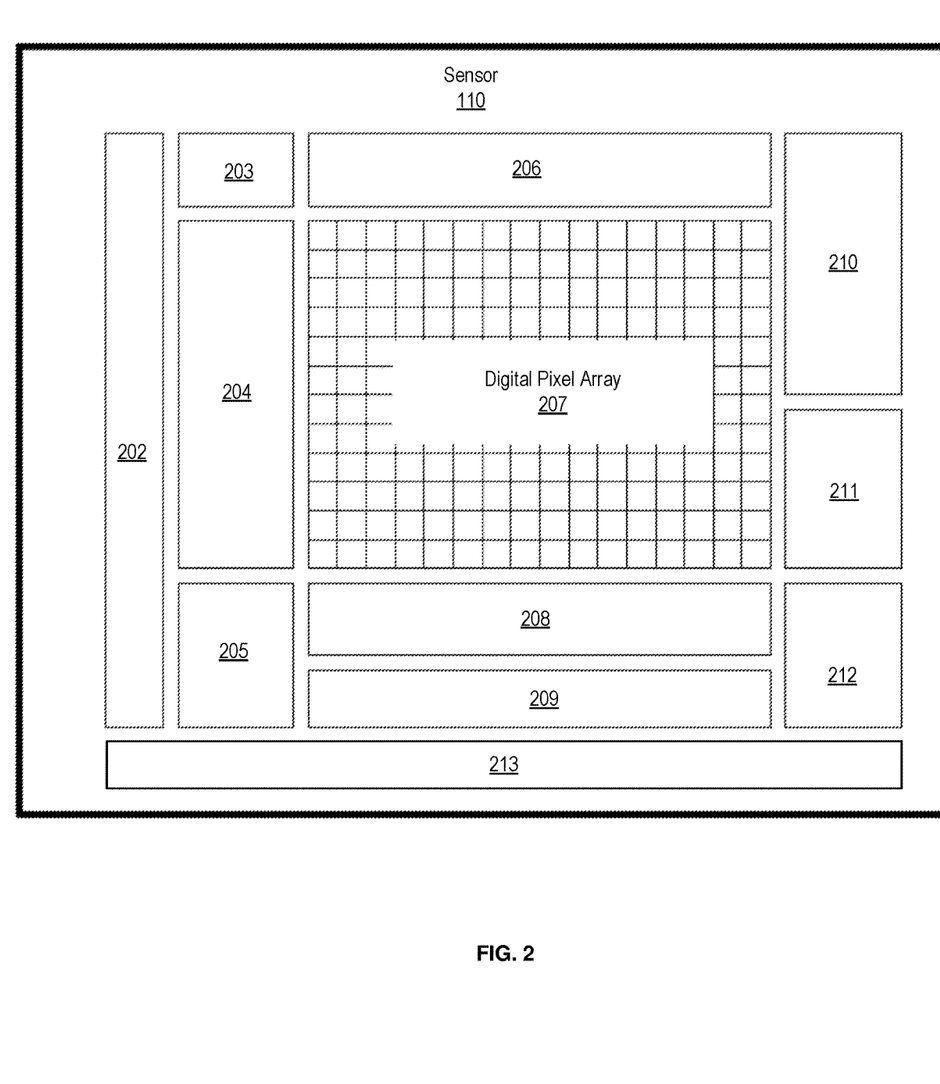
FIG. 2 is a view illustrating photo sensor architecture, according to one embodiment.

FIG. 2 is a view illustrating the photo sensor architecture, according to one embodiment. The sensor 110 includes, among other components, a digital block 202, a global counter 203, a row drivers and global signal drivers module 204, I2C 205, counter buffers 206, a digital pixel array 207, sense amplifiers 208, a line memory 209, a power conditioner 210, a ramp generation and buffers module 211, a sense amplification biasing module 212, and MIPI 213.

The digital block 202 is a circuit that processes digital signals associated with the operation of the sensor 110. In one or more embodiments, at least part of the digital block 202 may be provided as part of the digital pixel array 207 instead of being a circuit separate from the digital pixel array 207.

The global counter 203 is a digital sequential logic circuit constructed of cascading flip-flops, and provides counter signals to various components of the sensor 110.

The row drivers and global signal drivers module 204 is a circuit that provides signals to rows of pixels via scan lines (not shown). The signal provided to each row of pixels indicates sensing of image signal and/or resetting operations at each row of pixels.

I2C 205 is a serial interface for transmitting the exposure time information 160 from the SOC 130 to the sensor 110. An interface circuit communicates bi-directionally with the SOC 130, as described above with reference to FIG. 1. In some embodiments, the interface circuit includes the MIPI 213. An MIPI interface typically has a single clock lane and two data lanes (not shown) that carry serial data. These three lanes carry signals on pairs of wires where the signals are often differential. In some embodiments, the MIPI 213 has four data lanes for carrying pixel data.

The counter buffers 206 is a circuit that receives counter signals from the global counter 203, and sends signals to columns of pixels in the digital pixel array 207 to coordinate sensing and resetting operations.

The digital pixel array 207 includes a plurality of pixels. In one embodiment, the digital pixel array is arranged in two dimensions, addressable by row and column. Each pixel is senses light and outputs a signal corresponding to the intensity of the input light. Each pixel may include components as described below with reference to FIG. 3.

The sense amplifiers 208 are elements in the read circuitry that read out of the digital signals from the digital pixel array 207. The sense amplifiers 208 sense low amplitude signals from a bitline that represents the intensity of light captured by the pixels in the digital pixel array 207. The sense amplifiers 208 may generate a digital output signal by utilizing a high gain amplifier. In one or more embodiments, at least part of the sense amplifiers 208 may be included in the digital pixel array 207.

The line memory 209 temporarily stores the sensed digital values of the light intensity detected at the digital pixel array 207, as sensed by the sense amplifiers 208 and processed by digital block 202 before sending the digital values to the SOC 130 via MIPI 213 as the pixel information 120.

The power conditioner 210 is a circuit that improves the quality of the power that is delivered to components of the sensor 110. The power conditioner 210 may maintain and deliver a constant voltage that allows the components of the sensor 110 to function properly. In alternate embodiments, the power conditioner 210 is a power line conditioner which takes in power and modifies it based on the requirements of the components connected to the power line conditioner.

The ramp generator and buffers module 211 comprises a ramp generator and buffers. The ramp generator is a function generator that increases its voltage to a particular value. The ramp generator may be used to avoid jolts when changing a load. The buffers provide electrical impedance transformation from one circuit to another to prevent the ramp generator from being affected by the load.

The sense amplification biasing module 212 provides biasing voltage signal to the sense amplifiers 208. The biasing voltage signal is a predetermined voltage for the purpose of establishing proper operating conditions of the sense amplifiers 208 such as a steady DC voltage.

The I2C 205 is a serial interface for transmitting the sensor configuration information between the sensor 110 and the SOC 130. An interface circuit communicates bi-directionally with the SOC 130, as described above with reference to FIG. 1. In some embodiments, the interface circuit includes the MIPI 213.

Figure 3:
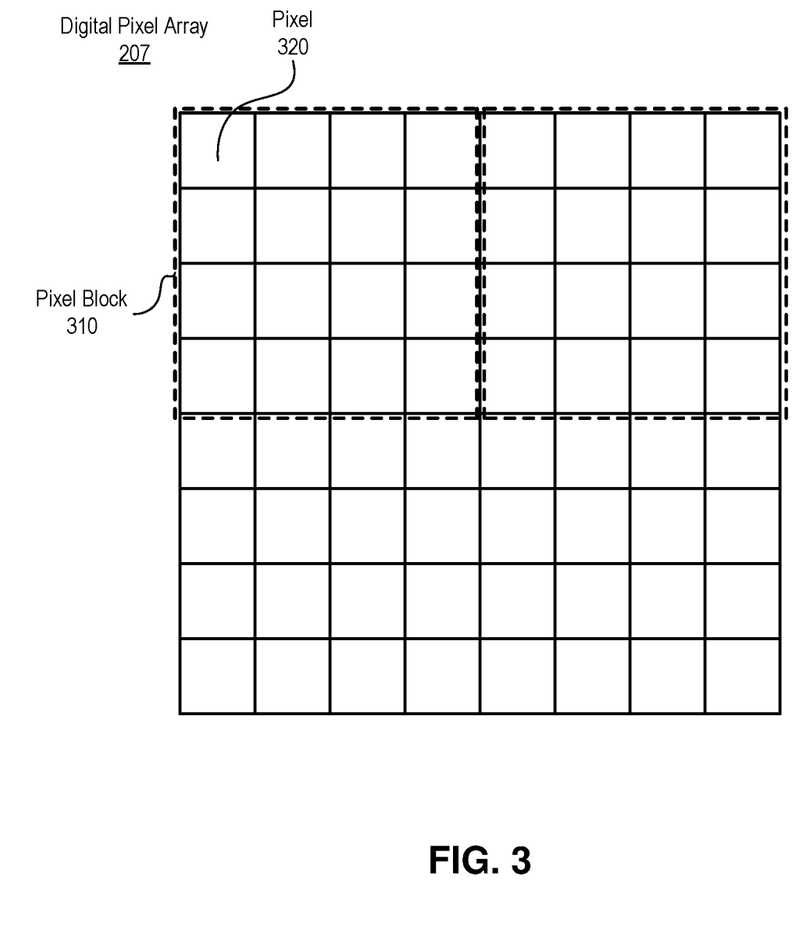
FIG. 3 is a diagram illustrating a digital pixel array of FIG. 2, according to one embodiment.

FIG. 3 is a diagram illustrating the digital pixel array 207 of FIG. 2, according to one embodiment. The digital pixel array 207 includes a plurality of pixels 320 arranged in a number of rows and columns. In the embodiment of FIG. 3, the digital pixel array 207 has eight rows and eight columns, or 64 total pixels.

The pixels 320 of the digital pixel array 207 are divided into pixel blocks 310, where each pixel block 310 contains one or more pixels 320. In the embodiment of FIG. 3, each pixel block 310 contains four rows and four columns, or 16 total pixels, and four pixel blocks 310 (not shown in FIG. 3) comprise the entire digital pixel array 207. In some embodiments, the pixel blocks 310 contain the same number of pixels 320. In alternative embodiments, the pixel blocks 310 contain a different number of pixels 320. As described above with reference to FIG. 1, the exposure start time and the exposure stop time of the exposure time information 160 are used to control the exposure time for a pixel block 310.

Example Stacked Photo Sensor Assembly

Figure 4:
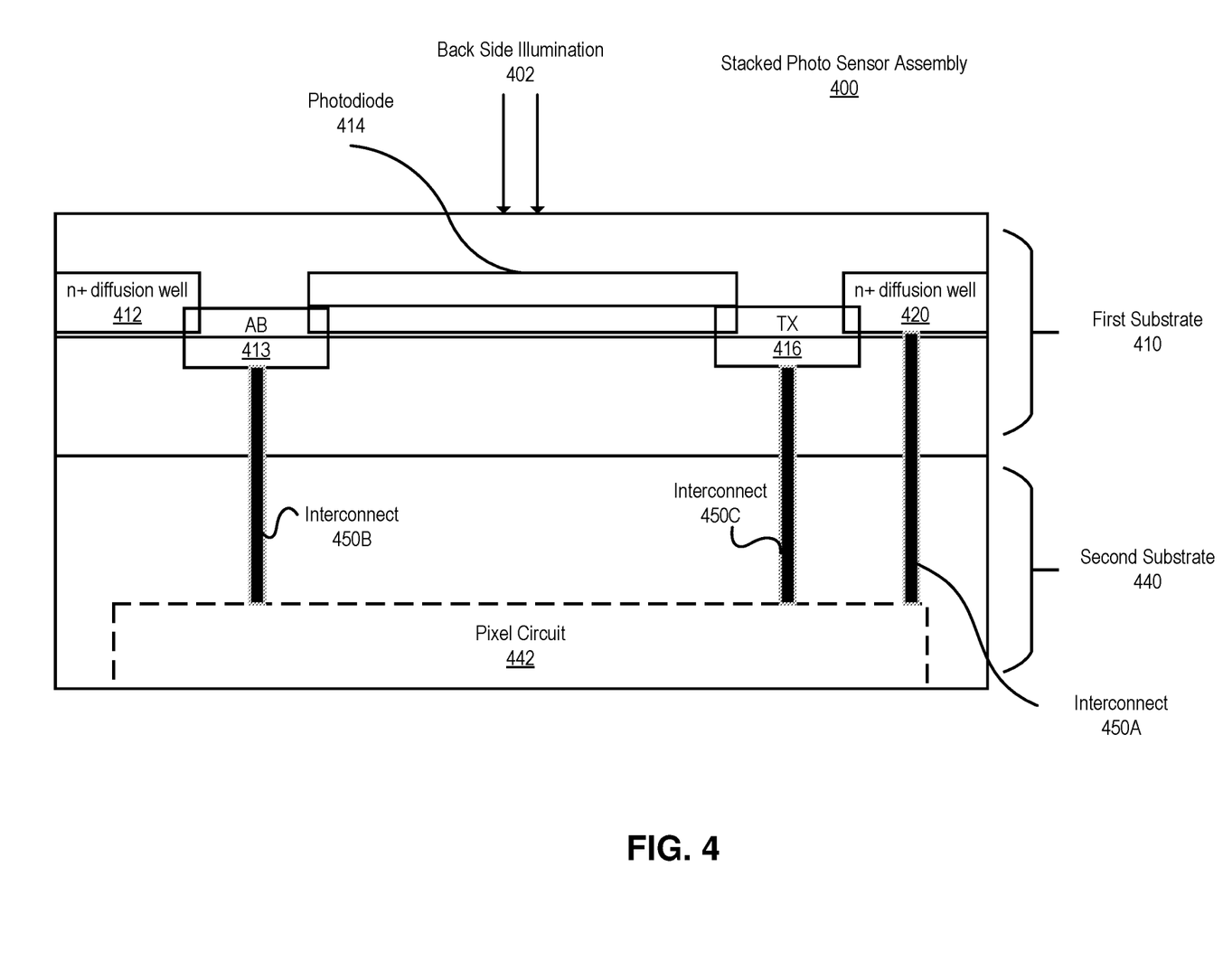
FIG. 4 is a cross-sectional view illustrating a photo sensor in a stacked assembly, according to one embodiment.

FIG. 4 is a cross-sectional view illustrating a photo sensor in a stacked assembly 400, according to one embodiment. In one embodiment, the stacked assembly 400 includes a first substrate 410 coupled to a second substrate 440. The first substrate 410 may be a back-side illumination 402 sensor that is flipped over and includes, among other components, a first n+ diffusion well 412, a photodiode 414, a transistor AB 413, a transistor TX 416, and a second n+ diffusion well 420.

Each of transistor AB 413 and transistor TX 416 includes an active layer, a drain electrode coupled to the active layer, a photodiode 414 that serves as a source of both transistor AB and transistor TX, an insulation layer over the active layer, and a gate electrode (not shown). By controlling a voltage level at the gates of the transistors AB 413 and the transistor TX 416, the transistors AB 413 and the transistor TX 416 can be turned on or off. The gates of these transistors receive signals from circuits external to the digital pixel array 207.

The first n+ diffusion well 412 is an N doped implant region formed in the first substrate 410. The first n+ diffusion well 412 receives photoelectrons that are transferred from the photodiode 414 when transistor AB 413 is turned on during non-exposure times. This is equivalent to a closed shutter mode in a traditional film camera. The transfer of photoelectrons from the photodiode 414 to the first n+ diffusion well 412 ensures that no photoelectrons are accumulated on the photodiode 414, as the non-exposure times are periods when no signal is generated. The first n+ diffusion well 412 is typically connected to a positive voltage source, for example VDD, so the photoelectrons are drained away. During an exposure time, which is equivalent to the shutter open mode in a film camera, both transistor AB 413 and transistor TX 416 are turned off and the photoelectrons are initially stored inside the photodiode 414. At the end of exposure, transistor TX 416 is turned on. As a result, the charge stored in the photodiode 414 is transferred to the second n+ diffusion well 420.

The photodiode 414 is a semiconductor device that converts light into an electric current. Current is generated when photons are absorbed in the photodiode 414. The photodiode 414 may be a p-n junction or PIN structure. When the intensity of light through back-side illumination 402 is higher, the amount of charge accumulated on the photodiode 414 is high. Similarly, when the intensity of light through back-side illumination 402 is lower, the amount of charge accumulated on the photodiode 414 is low.

The interconnect 450A may be a pixel level direct interconnect from the second n+ diffusion well 420 to a pixel circuit 442 in the second substrate 440. In one embodiment, the interconnect 450A transmits a voltage signal that reflects the amount of charge transferred from the photodiode 414 to the second n+ diffusion well 420. In alternative embodiments, the interconnect 450A transmits a current signal that reflects the amount of charge transferred from the photodiode 414 to the second n+ diffusion well 420. The interconnect 450A carries the voltage signal to the pixel circuit 442 for further processing such as sampling and analog-to-digital conversion. The pixel circuit 442 is described below with reference to FIG. 5.

The interconnects 450B, 450C transmit signals from the pixel circuit 442 of the second substrate 440 to the circuit of the first substrate 410. In one embodiment, the signals are timing signals of the exposure time information 160 of FIG. 1. The interconnect 450B receives a first timing signal that turns on or off a first transistor (e.g., transistor AB), and the interconnect 450C receives a second timing signal that turns on or off a second transistor (e.g., transistor TX).

Embodiments move various circuit components provided on the first substrate 410 in conventional photo sensors to the second substrate 440, and connect the circuits of the second substrate 440 to the components in the first substrate 410 via the pixel level interconnect 450. The various circuit components moved to the second substrate 440 may include, among others, switches, amplifiers and current source. In this way, the area occupied by components in the first substrate 410 can be beneficially reduced so further components, such as a block ADC and a block memory as described below, can be added without impacting the fill factor.

Figure 5:
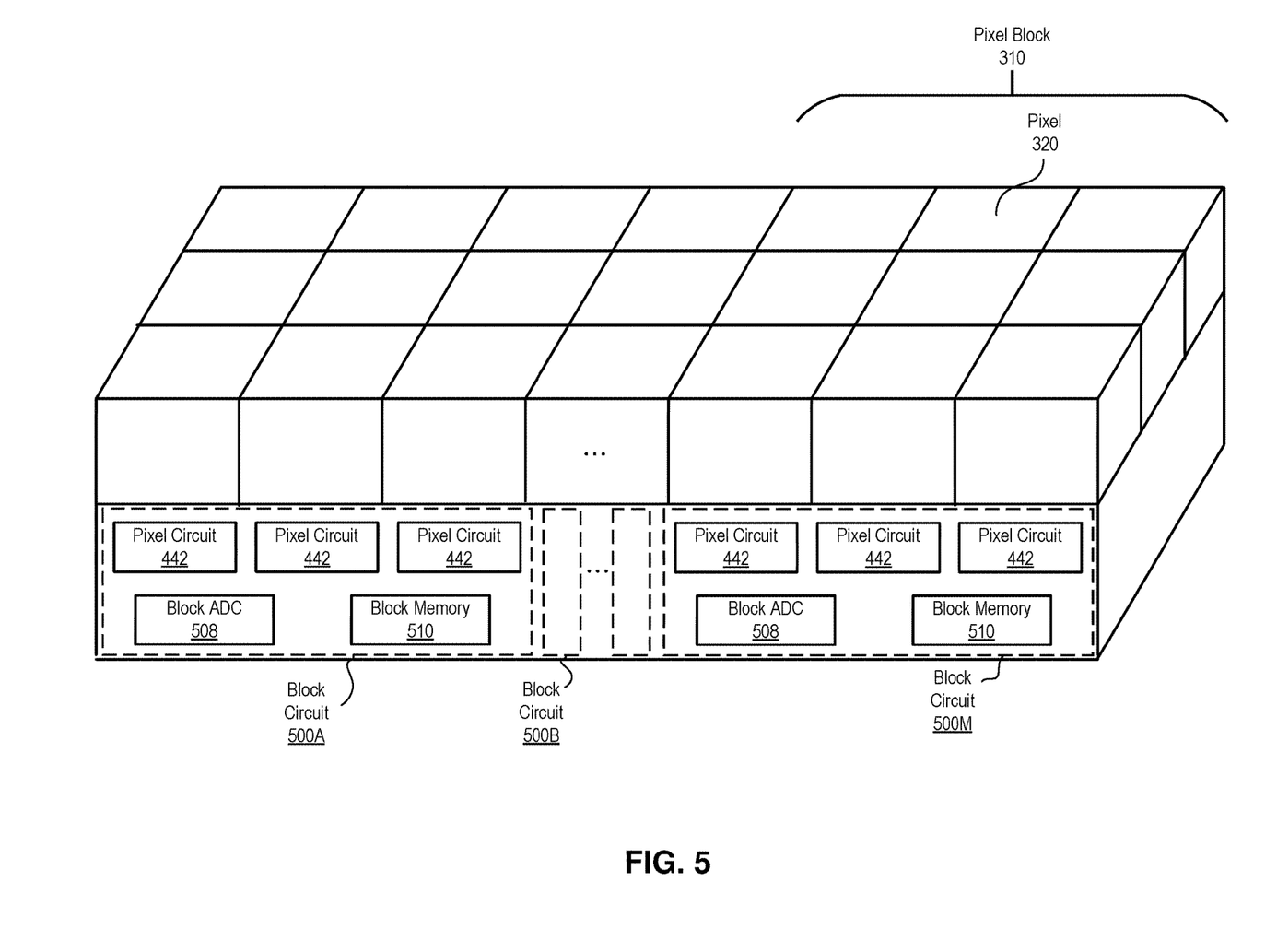
FIG. 5 is a diagram illustrating the digital pixel array of FIG. 3 and its associated block circuits, according to one embodiment.

FIG. 5 is a diagram illustrating the digital pixel array of FIG. 3 and its associated block circuits 500, according to one embodiment. In the embodiment of FIG. 5, the photo sensor includes an array of digital pixels 320 and a plurality of block circuits 500. Each block circuit 500 is provided for each pixel block 310 and includes, among other components, a plurality of pixel circuits 442, a block ADC 508, and a block memory 510. As described above with reference to FIGS. 3 and 4, the digital pixel array includes pixels divided into a plurality of blocks 310, and the pixels 320 include photodiodes and transistors controlling an exposure duration of the photodiodes for a current frame based on motion prediction.

The block memory 510 is a circuit that receives and stores exposure time information 160 for each block indicating an exposure duration for pixels in each block in the current frame. The exposure time information 160 is generated by performing motion prediction on prior frames captured by the pixels before capturing the current frame, as described above with reference to FIG. 1.

The block analog-to-digital converter (ADC) 508 circuit converts pixel signals from each block of pixels to digital pixel information. In one more embodiments, the quantization parameter of each of the block ADC 508 circuit is set according to the predicted light intensity information for each block. The quantization parameter may indicate, for example, the dynamic range of quantization at the ADC 508. That is, the quantization parameter may indicate how the bits should be assigned to different ranges of pixel voltage based on the predicted light intensity information for each block. If the pixel voltage is likely to be low across the pixels in the block, then more bits can be assigned to low pixel voltage range. If the pixel voltage is likely to be high across the pixels in the block, then more bits can be assigned to high pixel voltage range. If the dynamic range of pixel values are likely to large, then the bits can be assigned relatively uniform across a low pixel voltage and a high pixel voltage.

In addition or alternatively, the quantization parameter may indicate resolution of the quantization for the ADC 508. The resolution of the ADC 508 may be increased for a block where the highest light intensity and the lowest light intensity of pixels in the block vary significantly, while the resolution of the ADC 508 may be decreased for a block where the light intensity is substantially consistent across the pixels in the block. Each of the block ADC 508 circuit may be a single-sloped ADC with a slope of a reference voltage in the single-sloped ADC adjusted as the quantization parameter. In some embodiments, where the difference between the highest light intensity and the lowest intensity is small, the block ADC 508 circuit is a low-resolution ADC (e.g., 1-3 bits). It is advantageous to dynamically change the resolution of the block ADC 508, among other reasons, because the overall bandwidth for sending the pixel information 120 can be reduced.

Although the embodiment of FIG. 5 illustrated as providing different ADC for each block, the same ADC can be used across all pixel blocks 310 or a subset of the pixel blocks 310. In such cases, each ADC changes its dynamic range or resolution per each block or the subset of the pixel blocks.

Figure 6:
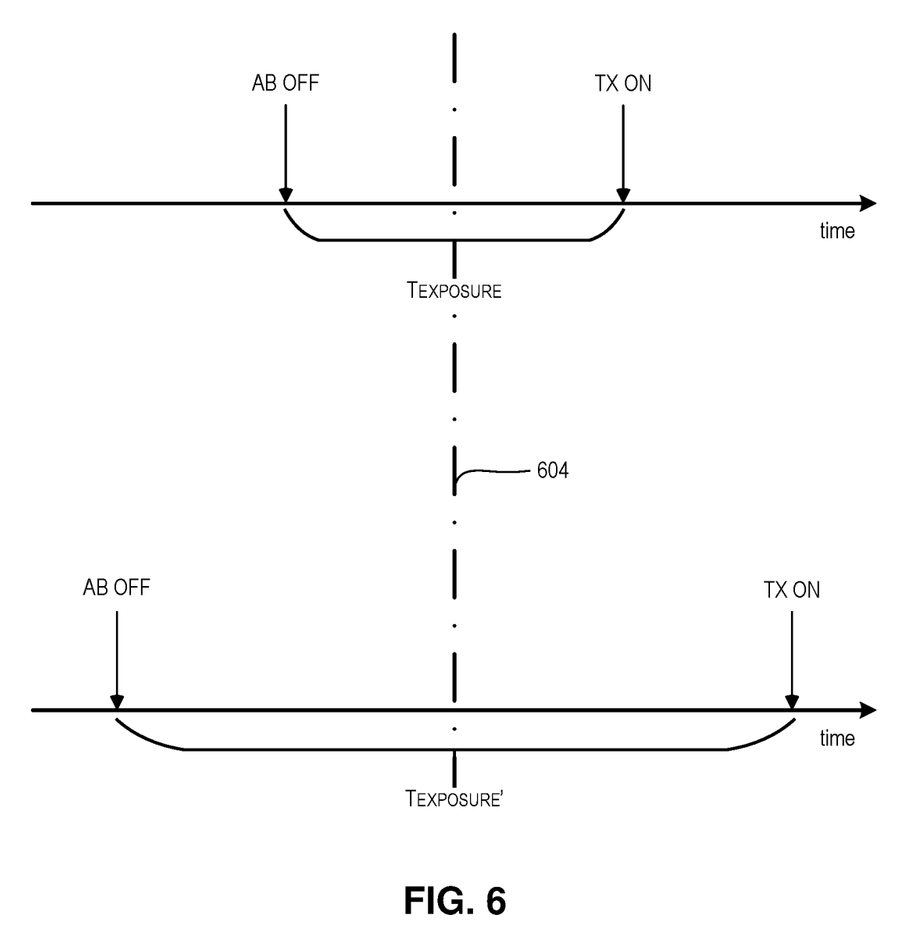
FIG. 6 is a diagram illustrating the exposure time of a brighter pixel block and the exposure time of a darker pixel block, according to one embodiment.

FIG. 6 is a diagram illustrating the exposure time of a brighter pixel block and the exposure time of a darker pixel block, according to one embodiment. A higher intensity of light is incident on a brighter pixel block than a darker pixel block. The top diagram illustrates the exposure time of a brighter pixel block and the bottom diagram illustrates the exposure time of a darker pixel block.

Referring to FIG. 4, the interconnects 450B-C transmit signals from the pixel circuit 442 of the second substrate 440 to the circuit of the first substrate 410. The interconnect 450B receives a first timing signal that turns off a first transistor (e.g., transistor AB), and the interconnect 450C receives a second timing signal that turns on a second transistor (e.g., transistor TX).

In the brighter pixel block, the intersection between the left arrow and the horizontal time axis represents the time at which the first timing signal is received via the interconnect 450B (i.e., the exposure start time). Transistor AB is turned off responsive to receiving the first timing signal. Transistor AB is off for exposure period $T_{EXPOSURE}$, which allows charge to accumulate in the photodiode. The intersection between the right arrow and the horizontal time axis represents the time at which the second timing signal is received via the interconnect 450C (i.e., the exposure stop time). At the end of the exposure period $T_{EXPOSURE}$, transistor TX is turned on responsive to receiving the second timing signal. As a result, the charge stored in the photodiode is transferred to the second n+ diffusion well, as described above with reference to FIG. 4.

Similarly, in the darker pixel block, the intersection between the right arrow and the horizontal time axis represents a time at which the first timing signal is received via the interconnect 450B (i.e., the exposure start time). The exposure period $T_{EXPOSURE}'$ of the darker pixel block is longer than the exposure period $T_{EXPOSURE}$ of the brighter pixel block. Photo sensors in different lighting conditions require longer or shorter exposure periods. Exposure time variation using prediction helps reduce over-exposure and under-exposure for some of the photo sensors, thereby providing correctly exposed images.

It is generally advantageous to align the center exposure time (i.e., a middle point time between the exposure start time and the exposure end time) represented by line 604 across all pixels when a global shutter mode is used or pixels in the same row when a rolling shutter is used. By doing so, motion artifacts in the captured image due to differing exposure start times and exposure end times of blocks can be reduced.

Example Method of Varying Exposure Times for Pixel Blocks Using Prediction

Figure 7:
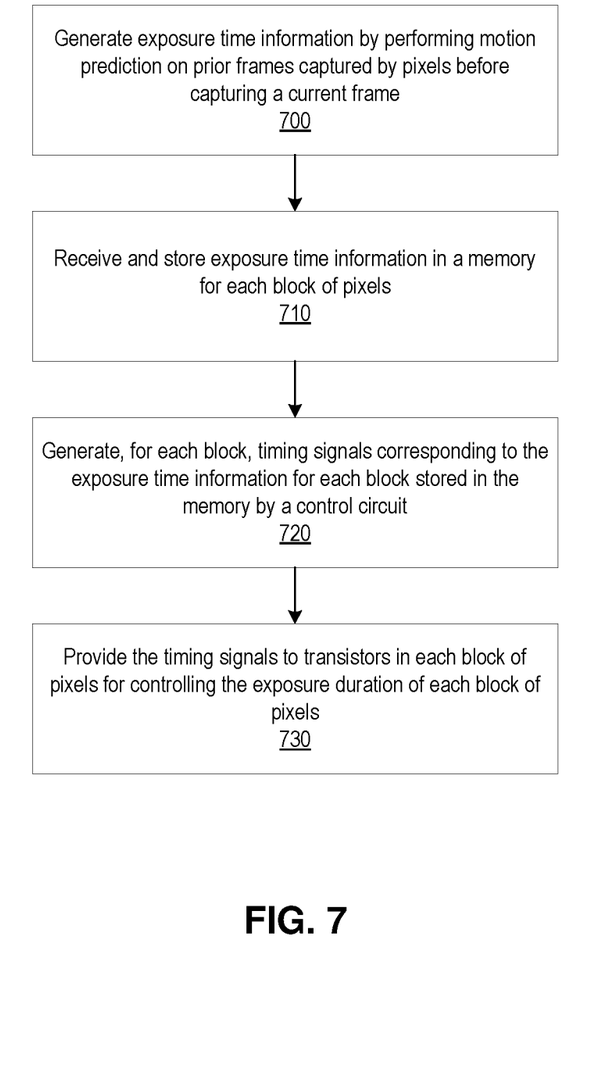
FIG. 7 is a flowchart illustrating a method of exposure time variation using prediction, according to one embodiment.

FIG. 7 is a flowchart illustrating a method of exposure time variation using prediction, according to one embodiment. A system on chip (SOC) including a motion estimation module and an image prediction module generates 700 exposure time information by performing motion prediction on prior frames captured by pixels before capturing a current frame.

A block circuit associated with a block of pixels receives and stores 710 exposure time information in a block memory for each block of pixels. The exposure time information includes predicted light intensity information of the current frame for each block indicating a highest light intensity and a lowest light intensity predicted from pixels in each block. The exposure time information also includes an exposure start time and an exposure end time. The exposure time information is provided to the sensor via a MIPI interface circuit with four data lanes.

A pixel circuit generates 720, for each block, timing signals corresponding to the exposure time information for each block stored in the block memory. The timing signals include a first timing signal that turns off a first transistor and a second timing signal that turns on a second transistor.

The pixel circuit provides 730 the timing signals to transistors in each block of pixels for controlling the exposure duration of each block of pixels. Providing the timing signals includes turning off a first transistor between a diffusion well and a photodiode in a pixel responsive to the first transistor receiving one of the timing signals, and turning on a second transistor between the photodiode and another diffusion well in the pixel responsive to the second transistor receiving another of the timing signals.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A photo sensor comprising:
   pixels divided into a plurality of blocks, the pixels comprising photodiodes and transistors controlling an exposure duration of the photodiodes;
   a memory configured to receive and store exposure time information for each block indicating an exposure duration for pixels in each block in a next frame, the exposure time information generated based on performing motion prediction on a current frame captured by the photo sensor; and
   a control circuit configured to generate, for each block, timing signals corresponding to the exposure time information for each block stored in the memory, the control circuit coupled to the transistors to provide the timing signals for controlling the exposure duration of each block of pixels to capture the next frame.

2. The photo sensor of claim 1, wherein the motion prediction is performed based on information from at least one of a motion sensing device or prior frames captured by the pixels before capturing the current frame.

3. The photo sensor of claim 1, wherein transistors in each of the pixels comprises a first transistor between a diffusion well and a photodiode, and a second transistor between the photodiode and another diffusion well.

4. The photo sensor of claim 3, wherein the timing signals comprise a first timing signal configured to turn off the first transistor and a second timing signal configured to turn on the second transistor.

5. The photo sensor of claim 1, wherein the photo sensor comprises a first substrate and a second substrate stacked on the first substrate, the first substrate comprising the photodiodes and the transistors, the second substrate comprising the memory and the control circuit.

6. The photo sensor of claim 1, wherein the photo sensor further comprises a plurality of analog-to-digital converter (ADC) circuits, each of the ADC circuits configured to convert pixel signals from each block of pixels to digital pixel information.

7. The photo sensor of claim 6, wherein the memory further stores predicted light intensity information for each block in the next frame indicating a predicted highest light intensity and a predicted lowest light intensity, and wherein a quantization parameter of each of the ADC circuits for each block in the next frame is set according to the predicted light intensity information for each block.

8. The photo sensor of claim 7, wherein the each of the ADC circuits comprises a single-sloped ADC with a slope of a reference voltage in the single-sloped ADC adjusted based on the quantization parameter.

9. The photo sensor of claim 7, wherein the quantization parameter indicate at least one of: a dynamic range of the ADC circuit, or a mapping between bits output by the ADC circuit and different portions of the dynamic range.

10. The photo sensor of claim 1, further comprising an interface circuit configured to communicate bi-directionally with a computing circuit configured to perform the motion prediction and generate the exposure time information.

11. The photo sensor of claim 10, wherein the interface circuit comprises an I2C and MIPI interface circuit configured to receive the exposure time information from the computing circuit.

12. The photo sensor of claim 1, wherein the exposure duration for the pixels in the each block in the next frame is generated based on predicted intensities of light captured by the pixels in the each block in the next frame; and
wherein the intensities of light captured by the pixels in the each block in the next frame are predicted based on motion vectors generated from the motion prediction.

13. An electronic device comprising:
a photo sensor having pixels divided into a plurality of blocks, the photo sensor configured to adjust an exposure duration each block of pixels in accordance with exposure time information and generate captured frames; and
a computing circuit operably coupled to the photo sensor, the computing circuit configured to:
perform motion prediction on a current frame captured by the photo sensor to determine distribution of light intensity predicted to be captured by pixels in each of the blocks in a next frame,
generate the exposure time information by processing the predicted distribution of light intensity, and
send the exposure time information to the photo sensor to capture the next frame.

14. The electronic device of claim 13, wherein the motion prediction is performed based on at least one of motion sensing device data or prior frames captured by the photo sensor.

15. The electronic device of claim 13, wherein the computing circuit is further configured to predict a highest light intensity and a lowest light intensity captured by the pixels in each block in the next frame, and wherein the photo sensor comprises an analog-to-digital conversion (ADC) circuit configured to quantize pixel signals from the pixels in each block in the next frame according to a quantization parameter set according to the predicted highest light intensity and the predicted lowest light intensity for each block.

16. A method comprising:
generating exposure time information by performing motion prediction on a current frame;
receiving and storing exposure time information in a memory for each block of pixels, the exposure time information indicating an exposure duration for pixels in each block in a next frame;
generating, for each block, timing signals corresponding to the exposure time information for each block stored in the memory by a control circuit; and
providing the timing signals from the control circuit to transistors in each block of pixels for controlling the exposure duration of each block of pixels to capture the next frame.

17. The method of claim 16, wherein the motion prediction is performed based on at least one of motion sensing device data or on prior frames captured by a photo sensor to determine distribution of light intensity predicted to be captured by pixels in each block in a current frame subsequent to the prior frames.

18. The method of claim 16, further comprising:
turning off a first transistor between a diffusion well and a photodiode in a pixel responsive to the first transistor receiving one of the timing signals; and
turning on a second transistor between the photodiode and another diffusion well in the pixel responsive to the second transistor receiving another of the timing signals.

19. The method of claim 18, wherein providing the timing signals comprises transmitting the timing signals from a first substrate comprising photodiodes of the pixels to a second substrate comprising the memory and the control circuit.

20. The method of claim 16, further comprising:
converting pixel signals from each block of pixels by an analog-to-digital converter (ADC) circuit to digital pixel information.

21. The method of claim 20, further comprising:
storing, in the memory, predicted light intensity information of the next frame for each block indicating a predicted highest light intensity and a predicted lowest light intensity; and
setting a quantization parameter of the ADC circuit for the next frame according to the predicted light intensity information for each block.

22. The method of claim 21, wherein setting the quantization parameter comprises a slope of a reference voltage in the ADC circuit, wherein the ADC circuit comprises a single-sloped ADC circuit.

\* \* \* \* \*